US011037855B2

(12) United States Patent
Koller et al.

(10) Patent No.: US 11,037,855 B2
(45) Date of Patent: Jun. 15, 2021

(54) CONTOURED-ON-HEAT-SINK, WRAPPED PRINTED WIRING BOARDS FOR SYSTEM-IN-PACKAGE APPARATUS

(71) Applicant: Intel IP Corporation, Santa Clara, CA (US)

(72) Inventors: Sonja Koller, Regensburg (DE); Reinhard Mahnkopf, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/467,582

(22) PCT Filed: Dec. 30, 2016

(86) PCT No.: PCT/US2016/069481
§ 371 (c)(1),
(2) Date: Jun. 7, 2019

(87) PCT Pub. No.: WO2018/125208
PCT Pub. Date: Jul. 5, 2018

(65) Prior Publication Data
US 2020/0043826 A1    Feb. 6, 2020

(51) Int. Cl.
*H01L 23/538* (2006.01)
*H01L 23/367* (2006.01)
*H01L 23/10* (2006.01)

(52) U.S. Cl.
CPC .......... *H01L 23/3675* (2013.01); *H01L 23/10* (2013.01); *H01L 23/5387* (2013.01)

(58) Field of Classification Search
CPC .................................................. H01L 23/3675
See application file for complete search history.

(56) References Cited

U.S. PATENT DOCUMENTS

| | | |
|---|---|---|
| 2006/0292756 A1* | 12/2006 | Primavera ........... H01L 21/4846 438/149 |
| 2009/0294955 A1 | 12/2009 | Webb |
| 2012/0187433 A1* | 7/2012 | Chen ................... H01L 25/0753 257/98 |
| 2013/0021769 A1* | 1/2013 | Fukuzono ........... H01L 23/4006 361/783 |

(Continued)

FOREIGN PATENT DOCUMENTS

| | | |
|---|---|---|
| KR | 1020060063963 A | 6/2006 |
| WO | WO-2018125208 A1 | 7/2018 |

OTHER PUBLICATIONS

"International Application Serial No. PCT/US2016/069481, International Search Report dated Sep. 21, 2017", 3 pgs.

(Continued)

*Primary Examiner* — Moazzam Hossain
(74) *Attorney, Agent, or Firm* — Schwegman Lundberg & Woessner, P.A.

(57) ABSTRACT

A system-in-package apparatus includes a contoured heat sink that provides a first recess and a subsequent recess. The system-in-package apparatus includes a flexible printed wiring board that is wrapped onto the contoured heat sink after a manner to enclose the first semiconductive device into the first recess and a semiconductive device in the subsequent recess.

11 Claims, 5 Drawing Sheets

(56) References Cited

U.S. PATENT DOCUMENTS

| | | | |
|---|---|---|---|
| 2014/0103519 A1* | 4/2014 | Steger | H01L 23/5385 |
| | | | 257/734 |
| 2014/0264821 A1* | 9/2014 | Tang | H01L 23/3675 |
| | | | 257/713 |
| 2015/0035134 A1* | 2/2015 | Hung | H01L 24/32 |
| | | | 257/712 |
| 2015/0162307 A1 | 6/2015 | Chen et al. | |
| 2017/0148764 A1* | 5/2017 | Wang | H01L 23/49838 |
| 2018/0206327 A1* | 7/2018 | Asao | H01L 25/072 |
| 2018/0212129 A1* | 7/2018 | Saito | H01L 33/647 |
| 2019/0174638 A1* | 6/2019 | Silvano de Sousa | H05K 1/0209 |
| 2019/0267312 A1* | 8/2019 | Koller | H01L 23/49575 |

OTHER PUBLICATIONS

"International Application Serial No. PCT/US2016/069481, Written Opinion dated Sep. 21, 2017", 6 pgs.

"International Application Serial No. PCT US2016 069481, International Preliminary Report on Patentability dated Jul. 11, 2019", 8 pgs.

\* cited by examiner

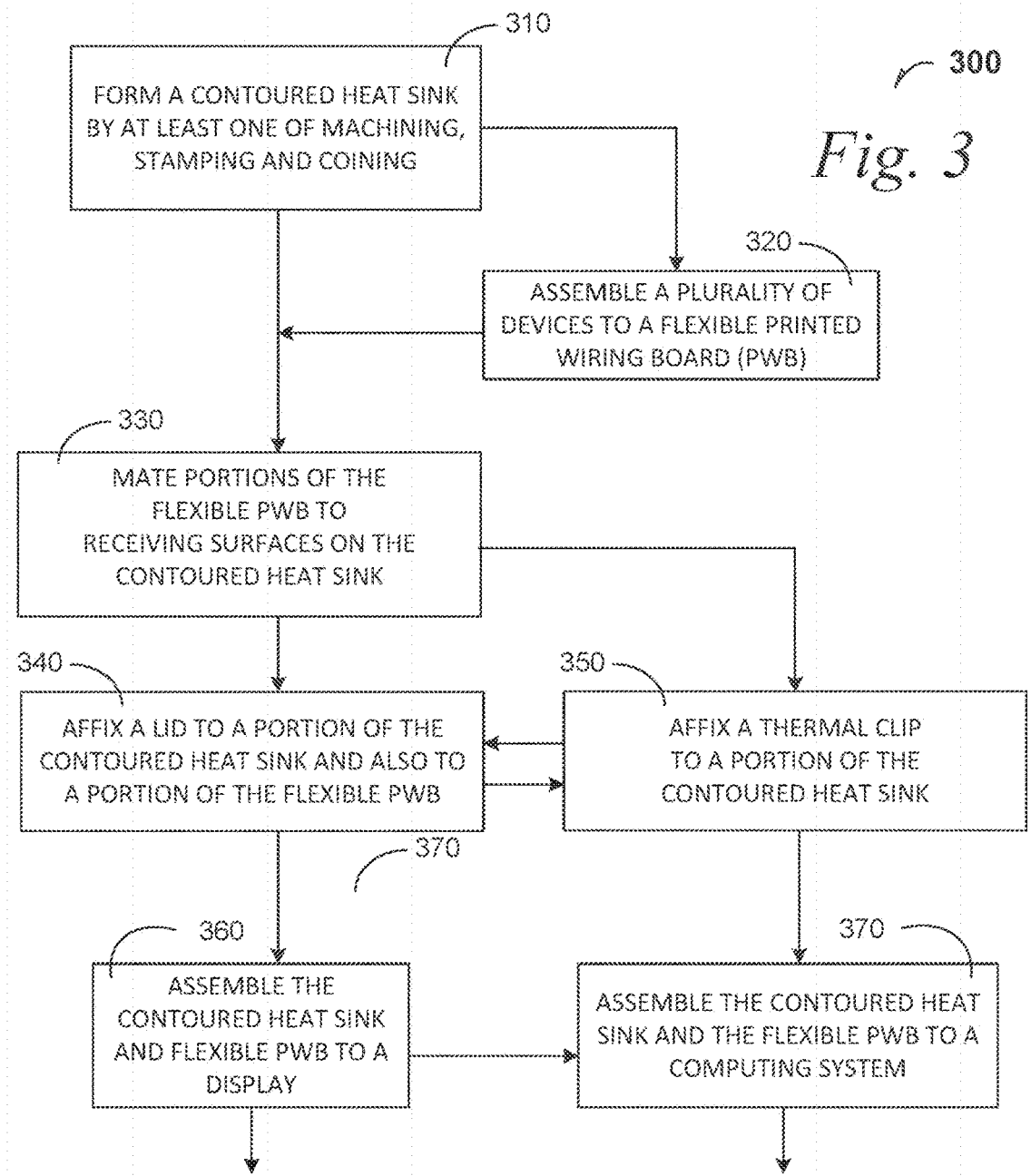

US 11,037,855 B2

CONTOURED-ON-HEAT-SINK, WRAPPED PRINTED WIRING BOARDS FOR SYSTEM-IN-PACKAGE APPARATUS

PRIORITY APPLICATION

This application is a U.S. National Stage Application under 35 U.S.C. 371 from International Application No. PCT/US2016/069481, filed Dec. 30, 2016, published as WO2018/125208, which is incorporated herein by reference in its entirety.

FIELD

This disclosure relates to system-in-package (SiP) configurations where a flexible printed wiring board is wrapped into a contoured heat sink.

BACKGROUND

Package miniaturization poses device-integration challenges, where both active and passive devices require physical protection and heat management while miniaturizing the package.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 3 is a process flow diagram for assembling the system in package apparatus that includes the contoured heat sink and the flexible PWB with several devices disposed on the PWB 20 according to an embodiment.

DETAILED DESCRIPTION

Figure 1A:
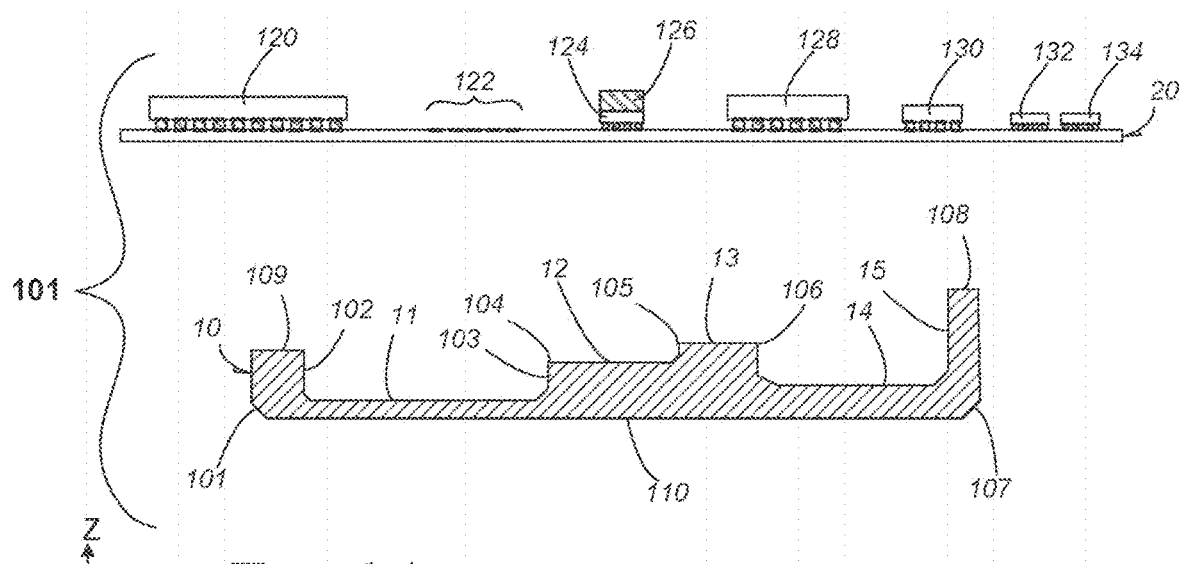
FIG. 1A is a cross-section elevation that illustrates a method of mating a contoured heat sink with a flexible printed wiring board (PWB)

Disclosed embodiments include contoured heat sink structures that accommodate both active and passive devices, where the contoured heat sink provides heat management, package rigidity, as well as device protection that are part of system-in-package apparatus. Equipment that uses digital methods that operate at a total digital transfer rate exceeding 50 gigabits/second (Gbit/s) is presented that may be used, whether for electrical, optical or wireless communication. Unidirectional data-transfer speeds at an interface may be above 50 Gbit/s, and for radio frequency communication above 32 GHz.

Mobile and wearable applications of disclosed embodiments are facilitated by mechanical stability and device protection, while also providing small and thin (sometimes curved but mostly flat) form factors as well as useful cooling for heat-generating devices. Additionally, automotive, aviation, and other field-employed applications are useful where a stamped or machined contoured heat sink may be adapted to an SiP apparatus.

Low Z-direction and thermal management embodiments of system in package apparatus are achieved by coupling integrated circuit device (IC device) backsides through thermal interface materials (TIMs) to contoured heat sinks. Additionally, the IC devices are disposed on a flexible printed wiring board (PWB) that is wrapped onto the contoured heat sink. More generally, the contoured heat sink may be referred to deflected contoured heat sink structures that are wrapped with a flexible PWB such that active device cooling is intrinsically provided by the contoured heat sink that also provides a low Z-profile, device protection, and mechanical stability.

Disclosed embodiments reveal useful configurations of a flexible PWB with the contoured heat sink such that. IC devices with a high power density may be isolated such as on a prominence (disclosed herein) such that a larger amount of heat sink material is located beneath (in Z-profile) the integrated circuit device and thermal coupling (heat soaking) toward adjacent devices is reduced.

Disclosed embodiments also reveal where partial stacking may allow a hot spot on a given IC device to be configured over a thickened portion of the contoured heat sink, while still allowing for stacking of the given IC device onto a neighboring IC device. Thereby, heat soaking is drawn more into the contoured heat sink than into the neighboring IC device.

Disclosed embodiments also reveal lids that conduct heat soak into the contoured heat sink by direct contact therebetween. Disclosed embodiments also reveal thermal clips that conduct heat soak into the contoured heat sink by direct contact therebetween.

Disclosed embodiments also reveal electromagnetic shielding of IC devices with a high power draw such as by a thermal interface material that may directly contact a thermal clip or a lid, and where useful, legs that extend from the thermal clip or the lid, may not only also facilitate heat removal, but also facilitate electromagnetic shielding.

FIGS. 1A through 1E illustrate a method of assembling a system in package apparatus on a contoured heat sink according to an embodiment.

FIG. 1A is a cross-section elevation 101 that illustrates a method of mating a contoured heat sink 10 with a flexible printed wiring board (PWB) 20. A mating method includes systematically locating portions of the flexible PWB 20 onto features of the contoured heat sink 10.

The contoured heat sink 10 includes a back surface 110 that appears to be substantially planar. In an embodiment, the back surface 110 is concave curved in the XZ-dimension such that corners 101 and 107 are lower in the XZ-dimension that where the reference line for item 110 touches the contoured heat sink 10 approximately near the center as measured in the X-direction. In an embodiment, the hack surface 110 is convex curved in the XZ-dimension such that corners 101 and 107 are higher in the Z-direction that where the reference line for item 110 touches the contoured heat sink 10 approximately near the center as measured in the X-direction.

In an embodiment, two contoured heat sinks may be mated at their respective back surfaces. For example two identical contoured heat sinks 10 may be mated back-to-back at their respective hack surfaces 110, either as mirror image back-to-back, inverted back-to-back, or one-quarter turn rotated back-to-back.

In an embodiment, the contoured heat sink 10 is of an integral metallic material. In an embodiment, the contoured heat sink 10 is a composite material such as a plastic material with a graphite coating. In an embodiment, the contoured heat sink 10 is a composite material such as a plastic material with graphite sheeting inserted in the interior. In an embodiment, the contoured heat sink 10 is machined in part from a metal blank such as from heat-sink grade copper, to achieve a desired shape and topology for packaging semiconductive and passive devices. In an embodiment, the contoured heat sink is stamped in part from a metal blank, such as heat-sink grade copper, to achieve a desired shape and topology for packaging semiconductive and passive devices. In an embodiment for when the contoured heat sink 10 is for a wearable device such as a watch bezel, and depending upon the total Z-direction height, a stamping process such as coining may be used to create a useful topology. In an embodiment, a stamping process is carried out in combination with a machining process.

The contoured heat sink 10 may be custom configured to accommodate a useful chip set for a given computing system. The contoured heat sink 10 may have external corners 101 and 107 that define manipulation of a contoured heat sink 10 near or at X-direction boundaries.

The depicted contoured heat sink 10 includes receiving surfaces 11, 12, 13, 14 and 15 that are useful for receiving substantially planar portions of the folded PWB 20. A receiving surface is defined as a feature of the contoured heat sink that can accommodate a portion of the folded PWB, where the folded PWB includes at least one device. Foldable portions of the flexible PWB 20 may include reduced stiffness to allow conformal bending more than a trace. In an embodiment, the entire PWB 20 enjoys a reduced stiffness such that conformal installment of the PWB 20 onto the topology of recesses, ledges and prominences is facilitated.

Included in the receiving surfaces of the contoured heat sink 10 are a first recess 11 and a subsequent recess 14. A recess is defined as a concave contour, including a planar surface that is useful to mate with a portion of a folded PWB, and two sidewalls. The first recess 11 includes the planar section 11 where the reference line for item 11 touches the contoured heat sink 10, as well as sidewalls 102 and 103. The subsequent recess 14 includes the planar section 14 where the reference line for item 14 touches the contoured heat sink 10, as well as sidewalls 105 and 15.

Included in the receiving surfaces is a ledge 12. A ledge is defined as a planar section with a precipice. The ledge 12 includes the planar section 12 where the reference line for item 12 touches the contoured heat sink 10, and a boundary of the ledge 12 includes a precipice 104. It may now be understood that a recess within a recess may be configured. For example, the composite of items 12 and 11 are a double recess bounded by the terminal end 109 and the prominence 13.

Included in the receiving surfaces is a prominence 13. A prominence is defined as a planar section and two ledges. The prominence 13 includes a planar section 13 where the reference line for item 13 touches the contoured heat sink 10, and two boundaries of a first precipice 105 and a second precipice 106.

It may now be understood that the back surface 110 communicates co-parallel through the metallic material to each of the first recess 11, subsequent recess 14, ledge 12, and prominence 13. By "communicates co-parallel through the metallic material" it may be understood in an embodiment that the back surface 110 is substantially parallel planar with each of the first recess 11, subsequent recess 14, ledge 12, and prominence 13, within useful parameters of making a IC device package.

Where the back surface 110 may be curvilinear, whether convex or concave, it may now be understood that the back surface communicates curvilinear-co-parallel through the metallic material of the contoured heat sink 10 to each of the first recess 11, subsequent recess 14, ledge 12, and prominence 13.

Included in the receiving surfaces is a high wall 15. A high wall is defined as a planar interior section of a boundary wall of the contoured heat sink 10. In the illustrated embodiment, the high wall 15 also defines a boundary for the subsequent recess 14. The high wall 15 includes a wall 15 of the contoured heat sink 10 where the reference line for item 15 touches the contoured heat sink 10, and the high wall 15 has a terminal end 108 of the contoured heat sink 10. It may now be understood that the back surface 110 communicates through the metallic material to each of the first recess 11, subsequent recess 14, ledge 12, and prominence 13. With the configuration of a high wall 15 with respect to the back surface 110 it may now be understood the back surface communicates orthogonally through the metallic material of the contoured heat sink 10 to the high wall 15. By "communicates orthogonally through the metallic material" it may be understood in an embodiment that the back surface 110 is substantially at a right angle with the high wall 15, within useful parameters of making a IC device package. Other high wall configurations may be made where e.g., a 45° wall replaces the high wall 15. A customized configuration embodiment may be a non-orthogonal high wall that forms a chassis custom fit to a receiving surface. Additionally, a flange may appear e.g., opposite the high wall 15 that may be used for bolting or clamping onto a customized receiving surface.

Other features of the contoured heat sink 10 may be present without receiving portions of a given flexible PWB that bears a device.

The flexible PWB 20 is pre-configured with devices that will be mated against receiving surfaces of the contoured heat sink 10. Illustrated with the flexible PWB 20 include devices 120, 124, 128, 130, 132 and 134. Also illustrated is a device footprint 122 for which a device 150 (see FIG. 2xz) will be mounted. Also illustrated is a thermal interface material (TIM) 126 for direct contact with a mechanical attachment facilitates heat removal (see FIG. 2).

Figure 1B:
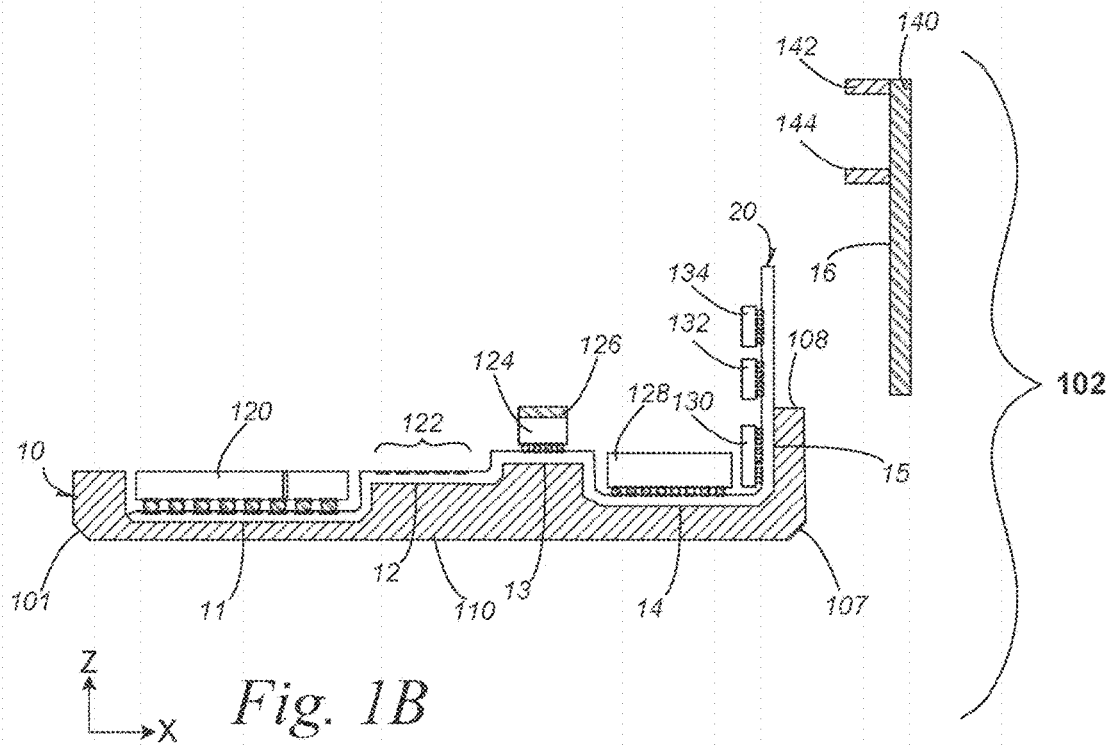
FIG. 1B is a cross-section elevation during assembly of the contoured heat sink and the flexible PWB depicted in FIG. 1A after further processing according to an embodiment.

FIG. 1B is a cross-section elevation 102 during assembly of the contoured heat sink 10 and the flexible PWB 20 depicted in FIG. 1A after further processing according to an embodiment. Receiving surfaces 11, 12, 13, 14 and 15 are indicated from the side opposite illustrated in FIG. 1A, and the respective reference lines indicate where planar portions of the flexible PWB 20 mate to the receiving surfaces. It can be seen that although the flexible PWB 20 has been fitted to the several receiving surfaces 11, 12, 13, 14 and 15, a portion of the flexible PWB 20 extends vertically in the Z-direction and that portion includes the devices 132 and 134.

In an embodiment, a lid 140 including legs 142 and 144 is configured to mate with the vertically extending portion of the flexible PWB 20 at a lid receiving surface 16. The lid 140 may be affixed by any useful method such as with a screw fastener. The lid 140 may be affixed by any useful method such as with a rivet.

Figure 1C:
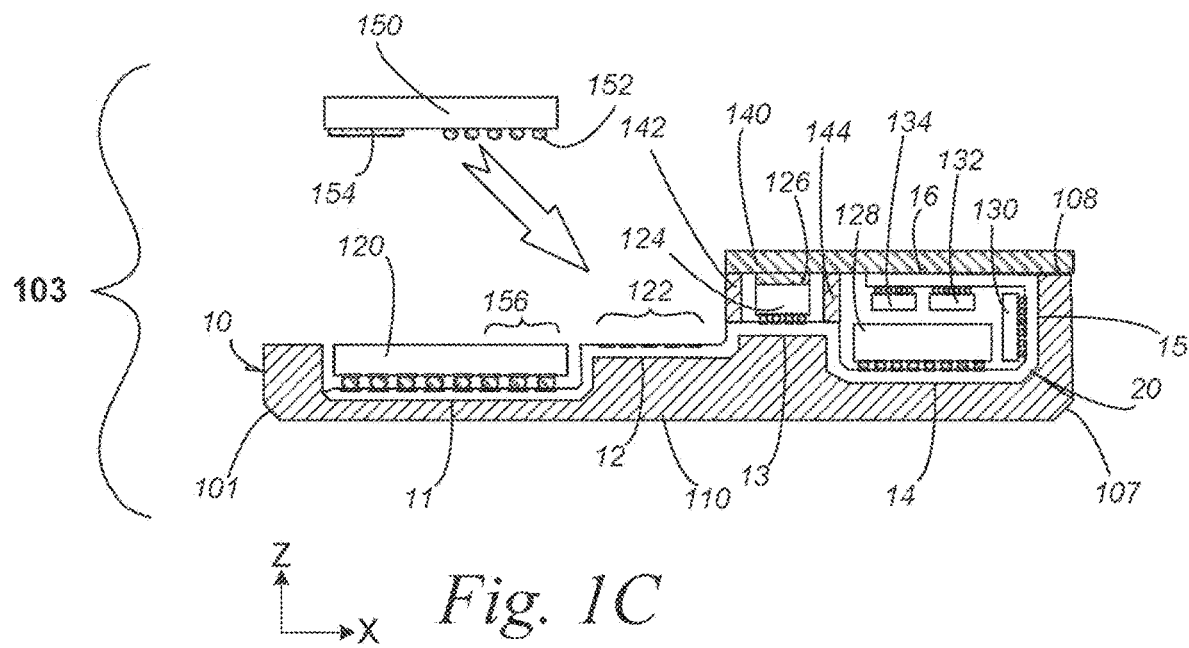
FIG. 1C is a cross-section elevation during assembly of the contoured heat sink and the flexible PWB depicted in FIG. 1B after further processing according to an embodiment.

FIG. 1C is a cross-section elevation 103 during assembly of the contoured heat sink 10 and the flexible PWB 20 depicted in FIG. 1B after further processing according to an embodiment. The lid 140 has been installed by seating one portion against the terminal end 108 of the contoured heat sink 10, as well as seating the legs 142 and 144 upon the flexible PWB 20 where it interfaces at the prominence 13 and the legs 142 and 144 are also seated astride the device 124. In other words, the device 124 is disposed on the flexible PWB 20 on the prominence 13 and adjacent the two legs 142 and 144. It can also be seen that the TIM 126 has mated to the lid 140.

After affixing the lid 140 onto the contoured heat sink 10 and the flexible PWB 20, a device 150 may be seated such that it electrically connects bumps, one of which is indicated with item number 152 on the device footprint 122, but also an adhesive film 154 is configured to attach to the device 120 at an adhesive-film footprint 156. The configuration of the device 150 on both the ledge 12 and the device 120 may be referred to as partial stacking.

In a mathematical simulation embodiment, the device 126 is modeled as a high power density IC device 126, and the devices 150 and 120 are respective memory and baseband processor IC devices. During mathematical simulation a comparison is was made to a configuration of the memory and baseband dice being configured in a stack, and the high power density device being shielded and located adjacent the stack. By comparison, the high power density device 124 experienced a heat drop of 11° C. temperature drop, the memory die a 3° C. temperature drop, and the baseband processor die a 1° C. temperature drop. Consequently by use of the flexible PWB 20 folded into the contoured heat sink 10 and in this mathematical simulation, both a higher integration density is achieved as well as a lower expected operating temperature under field-use conditions achieved during the mathematical simulation.

Figure 1D:
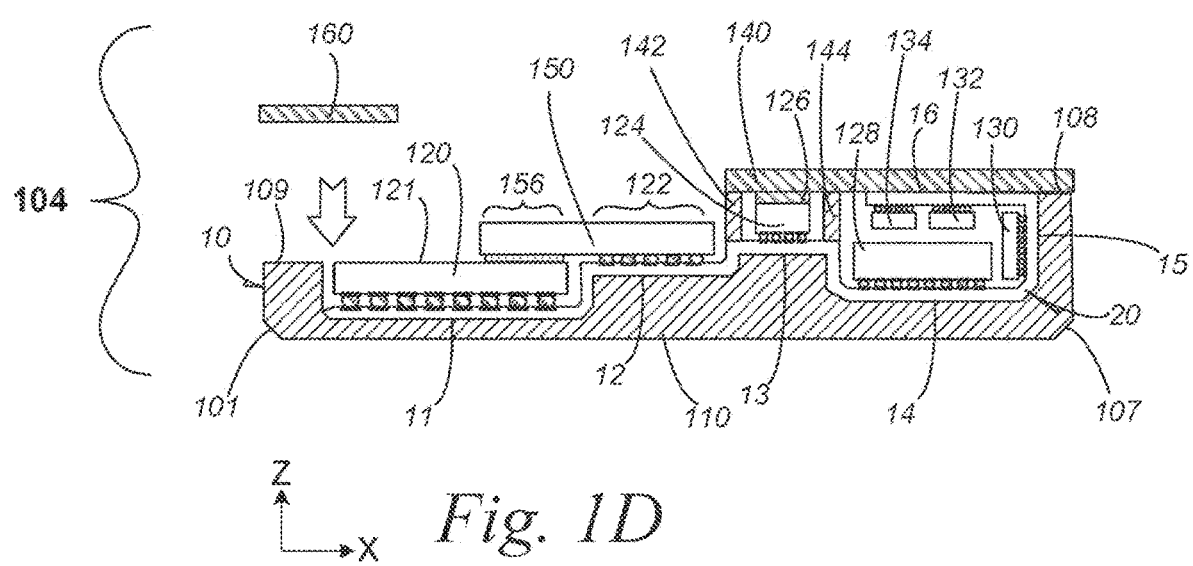
FIG. 1D is a cross-section elevation during assembly of the contoured heat sink and the flexible PWB depicted in FIG. 1B after further processing according to an embodiment.

FIG. 1D is a cross-section elevation 104 during assembly of the contoured heat sink 10 and the flexible PWB 20 depicted in FIG. 1B after further processing according to an embodiment. After seating the device 150 onto the footprints 122 and 156, a thermal clip 160 is directed toward the terminal end 109 of the contoured heat sink 10 such that the thermal clip 160 has contact with the device 120 at a back side 121. Consequently, the thermal clip 121 functions both to hold the device 120 for physical integrity and protection, as well as to provide a heat-flow channel into the contoured heat sink 10 at the terminal end 109. The thermal clip 160 may be affixed by any useful method such as with a screw fastener or a rivet.

Figure 2X:
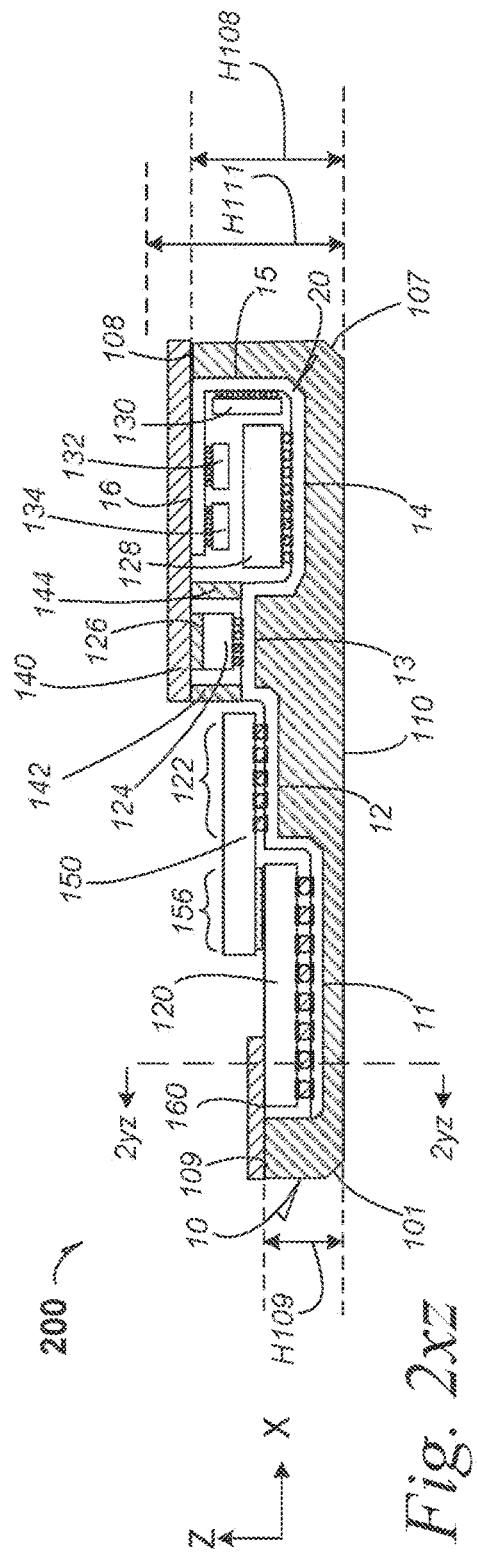
FIG. 2xz is a cross-section elevation of a system-in-package apparatus that includes a contoured heat sink and a flexible printed wiring board with several devices disposed on the PWB according to an embodiment.

FIG. 2xz is a cross-section elevation of a system-in-package (SiP) apparatus 200 that includes a contoured heat sink 10 and a flexible printed wiring board 20 with several devices disposed on the PWB 20 according to an embodiment. The SiP apparatus 200 is a further assembled apparatus as seen previously in FIGS. 1A through 1D, including the thermal clip 160 having been affixed to the contoured heat sink 10 at the terminal end 109.

Figure 2Y:
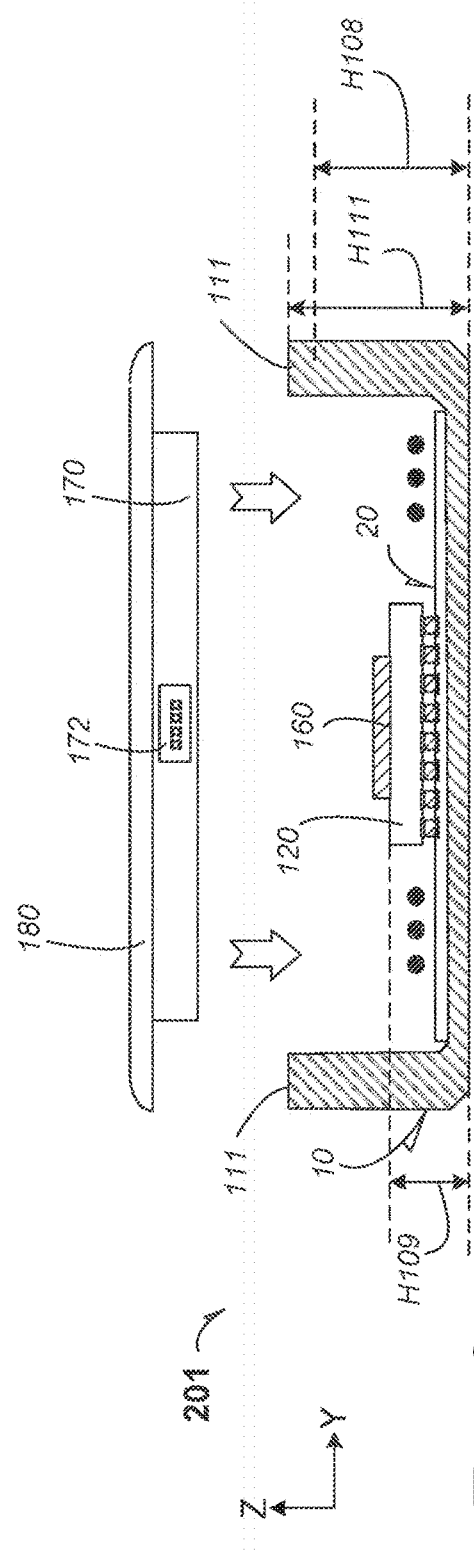
FIG. 2yz is a cross-section elevation including a partial view of the device disposed on the flexible PWB as it is disposed within the contoured heat sink according to an embodiment.

FIG. 2yz is a cross-section elevation including a partial view 201 of the device 120 disposed on the flexible PWB 20 as it is disposed within the contoured heat sink 10. The device 120 is depicted between ellipses for illustrative purposes as other structures may be found adjacent the device 120 when viewed in cross section. In an embodiment, the device 120 substantially extends across the entire illustrated breadth of the flexible PWB 20 such that no other device is disposed on the flexible PWB 20 at the illustrated cross section.

The view 201 is taken from FIG. 2xz along the section line 2yz. It can be seen that the thermal clip 160, depicted in FIG. 2xz, holds the device 120 in place. In an embodiment, terminal ends 111 of the contoured heat sink 10 are higher (height H111) than both of the terminal ends 108 (height H108) and 109 (height H109) illustrated in FIG. 2xz. The illustrated heights are depicted as relative heights and not necessarily as mathematical ratios. For example as illustrated in FIG. 2xz, the terminal end 109 upon which the thermal clip 160 is seated, may be a notch in the contoured heat sink 10. For example as illustrated in FIG. 2xz, the terminal end 108 upon which the lid 140 is seated, may be a notch in the contoured heat sink 10. In an embodiment, formation of a given notch is part of a stamping process of the contoured heat sink 10, followed by machining the notch at the level of the terminal end 108.

In an embodiment, the terminal ends 111 of the contoured heat sink 10 provide an upper surface that allows for mating of more structure and device functionality. The terminal end 109 may be referred to as a lower ledge 109, the terminal end 108 may be referred to as an upper ledge 108, and the terminal ends 111 may be referred to as an upper rim 111. It may now be understood that the Y-dimension of the thermal clip 160 may fit into a notch of the contoured heat sink 10 that also has approximately the same Y-dimension length, but larger. Similarly, it may now be understood that the Y-dimension of the lid 140 may fit into a notch of the contoured heat sink 10 that also has approximately the same y-dimension length, but larger.

For example in an embodiment, where the SiP apparatus 200 is a wrist watch computing system, a touch display 180 may be mated at the terminal ends 111. For example in an embodiment, where the SiP apparatus 200 is a hand-held telephonic computing system, a touch display 180 may be mated at the terminal ends 111. For example in an embodiment, where the SiP apparatus 200 is a tablet computing system, a touch display 180 may be mated at the terminal ends 111.

In an embodiment, a power source 170 such as a battery 170 may be mated with the touch display 180 where the battery 170 may fit above the lower topology above the thermal clip 160. In an embodiment, the battery 170 may fit above the lower topology above the device 150 while still being below the terminal ends 111 that form an upper rim of the contoured heat sink 10. In an embodiment, a power coupling 172 is connected to the battery 170 and the power coupling 172 may be accessed through the notch that is created in the contoured heat sink 10 that is also formed for the thermal clip 160. In an embodiment, the power source 170 includes both AC coupling capability through the power coupling, as well as DC power delivery capability when the power source 170 acts as a battery.

FIG. 3 is a process flow diagram 900 for assembling the system in package apparatus that includes the contoured heat sink 10 and the flexible PWB 20 with several devices disposed on the PWB 20 according to an embodiment.

At 310, the process includes forming a contoured heat sink by at least one of machining, stamping and coining a heat sink blank. Other contouring methods may be used such as molding a metal-graphite-plastic composite, followed by sintering.

At 320, the process includes assembling a plurality of devices to a flexible printed wiring board.

At 330, the process includes mating portions of the flexible printed wiring board to receiving surfaces on the contoured heat sink.

At 340, the process includes affixing a lid to a portion of the contoured heat sink and also to a portion of the flexible PWB.

At 350, the process includes affixing a thermal clip to a portion of the contoured eat sink.

At 360, the process includes assembling the contoured heat sink and flexible PWB to a display.

At 370, the process includes assembling the system in package that exists as the contoured heat sink and the flexible PBW, to a computing system.

Figure 4:
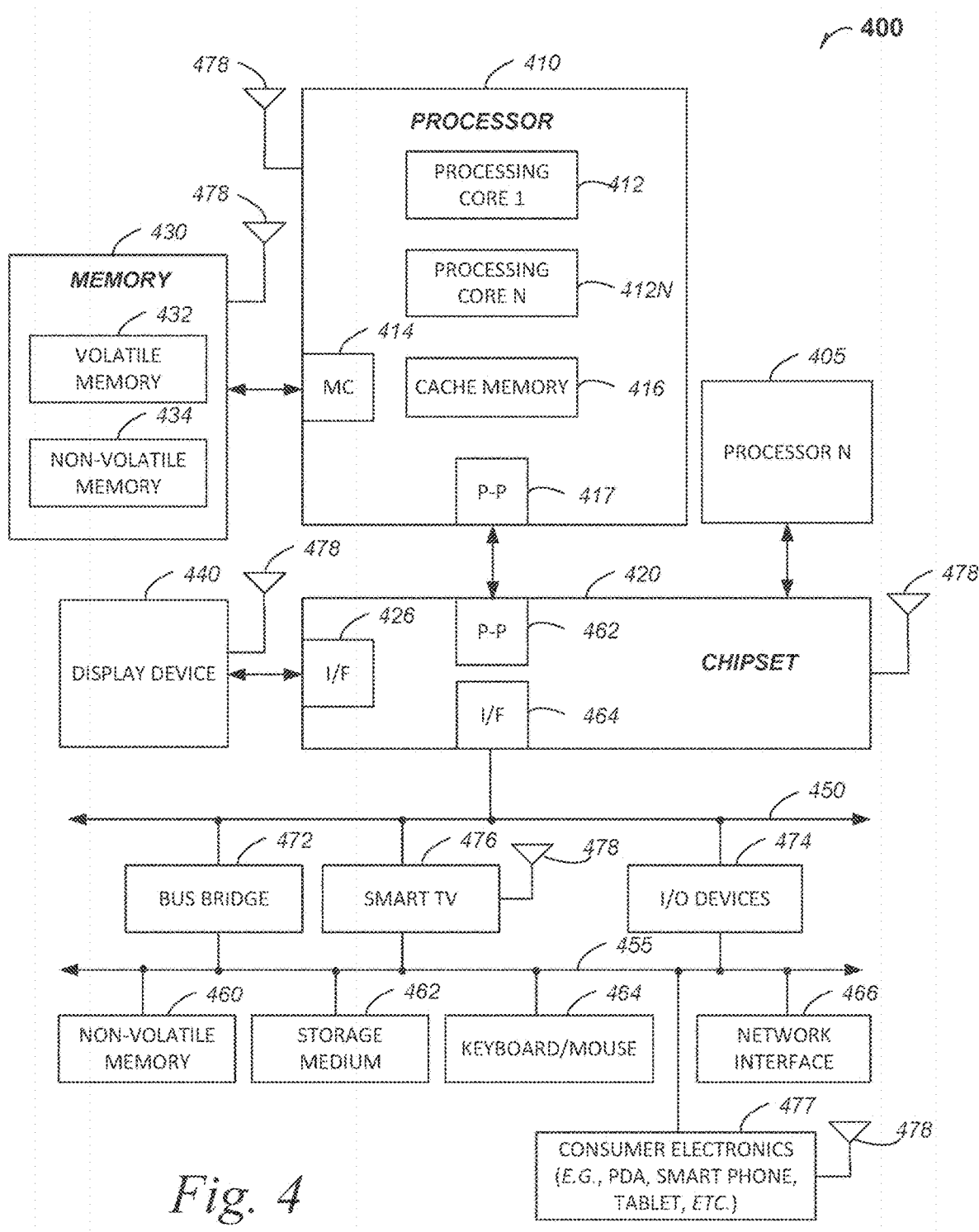
FIG. 4 is included to show an example of higher level device applications for the disclosed embodiments.

FIG. 4 is a computing system 400 according to an embodiment. FIG. 4 illustrates a system level diagram, according to one embodiment of the invention. For instance, FIG. 4 depicts an example of a microelectronic device that includes a system-in-package apparatus with a contoured heat sink and a wrapped printed wiring board embodiment as described in the present disclosure. The computing system may also include a sensor such as a motion sensor. For example the device 134 depicted in FIG. 1D may be a sensor.

FIG. 4 is included to show an example of a higher level device application for the disclosed embodiments. In an embodiment, a system 400 includes, but is not limited to, a desktop computer. In an embodiment, a system 400 includes, but is not limited to a laptop computer. In an embodiment, a system 400 includes, but is not limited to a netbook. In an embodiment, a system 400 includes, but is not limited to a tablet. In an embodiment, a system 400 includes, but is not limited to a notebook computer. In an embodiment, a system 400 includes, but is not limited to a personal digital assistant (PDA). In an embodiment, a system 400 includes, but is not limited to a server. In an embodiment, a system 400 includes, but is not limited to a workstation. In an embodiment, a system 400 includes, but is not limited to a cellular telephone. In an embodiment, a system 400 includes, but is not limited to a mobile computing device. In an embodiment, a system 400 includes, but is not limited to a smart phone. In an embodiment, a system 400 includes, but is not limited to an Internet appliance. Other types of computing device may be configured with the microelectronic device that includes a system-in-package apparatus with a contoured heat sink and a wrapped printed wiring board embodiment.

In some embodiments, the system-in-package apparatus with a system-in-package apparatus with a contoured heat sink and a wrapped printed wiring board embodiment 400 includes a system on a chip (SOC) system.

In an embodiment, the processor 410 has one or more processing cores 412 and 412N, where 412N represents the Nth processor core inside processor 410 where N is a positive integer. In an embodiment, the electronic device system 400 using a system-in-package apparatus with a contoured heat sink and a wrapped printed wiring board embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the SiP device system 400. The cache memory 416 may be organized into a hierarchal structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using a system-in-package apparatus with a contoured heat sink and a wrapped printed wiring board embodiment as set forth in this disclosure. The chipset 420 enables the processor 410 to connect to other elements in the SiP device system 400. In an embodiment, interfaces 417 and 422 operate in accordance with a PtP communication protocol such as the Intel® QuickPath Interconnect (QPI) or the like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In and embodiment, the processor 410 and the chipset 420 are merged into a single SOC. Additionally, the chipset 420 connects to one or more buses 450 and 455 that interconnect various elements 474, 460, 462, 464, and 466. Buses 450 and 455 may be interconnected together via a bus bridge 472. In an embodiment, the chipset 420 couples with a non-volatile memory 460, a mass storage device(s) 462, a keyboard/mouse 464, and a network interface 466 by way of at least one of the interface 424 and 474, the smart TV 476, and the consumer electronics 477, etc.

In and embodiment, the mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the SiP apparatus in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412. Where useful, the computing system 400 may have an outer shell that is part of the several land side board embodiments described in this disclosure. For example in FIG. 1, arrow 20 indicates the PWB 20, but the arrow touches the PWB on the surface opposite where all devices are mounted. Where arrow 20 touches the PWB may also be at least part of an outer shell. Similarly and additionally, the housing structure 832 depicted in FIG. 8 may be at least part of an outer shell and the portion of the PWB 20 depicted in FIG. 8 that is opposite the side were devices are mounted, and not covered by the housing structure 832, may be part of the outer shell of the computing system 400 depicted in FIG. 4.

Example 1 is a system-in-package apparatus comprising: a contoured heat sink made of an integral metallic material, the contoured heat sink including a back surface, and receiving surfaces of a first recess, a subsequent recess, a ledge including a precipice, and a prominence, and wherein the hack surface communicates through the metallic material to each of the first recess, subsequent recess, ledge, and prominence; a flexible printed wiring board (PWB), wherein a plurality of devices is disposed upon the flexible PWB, and wherein some of the plurality of devices on the flexible PWB is mated to the flexible PWB where the flexible PWB is disposed against a receiving surface of the contoured heat sink; and wherein the flexible PWB forms a contoured configuration touching each of the first recess, the subsequent recess, the ledge, and the prominence.

In Example 2, the subject matter of Example 1 optionally includes a lid attached to an upper ledge of the contoured heat sink, wherein a portion of the flexible PWB is mated to the lid, and wherein at least one device mounted on the flexible PWB is disposed on the portion of the flexible PWB mated to the lid.

In Example 3, the subject matter of any one or more of Examples 1-2 optionally include a lid attached to an upper ledge of the contoured heat sink, wherein a portion of the flexible PWB is mated to the lid, and wherein at least one device mounted on the flexible PWB is disposed on the portion of the flexible PWB mated to the lid; and at east one leg extending from the lid, wherein the at least one leg contacts the flexible PWB.

In Example 4, the subject matter of any one or more of Examples 1-3 optionally include a thermal clip attached to a lower ledge of the contoured heat sink, wherein the thermal clip contacts a device at a back side thereof.

In Example 5, the subject matter of any one or more of Examples 1-4 optionally include wherein the contoured heat sink includes a lower ledge, an upper ledge, and an upper rim, wherein the upper rim is higher than the upper ledge, and wherein the lower ledge and the upper ledge each form a notch in the upper rim.

In Example 6, the subject matter of any one or more of Examples 1-5 optionally include a touch screen disposed upon the upper rim.

In Example 7, the subject matter of any one or more of Examples 1-6 optionally include a power source disposed below the upper rim.

In Example 8, the subject matter of any one or more of Examples 1-7 optionally include wherein the first recess contains a processor integrated circuit (IC) device, the ledge supports a memory IC device, and wherein the memory IC device is disposed on the processor IC device.

In Example 9, the subject matter of any one or more of Examples 1-8 optionally include wherein the first recess contains a processor integrated circuit (IC) device, the ledge supports a memory IC device, and wherein the memory IC device is partially disposed on the processor IC device and partially disposed above the ledge.

In Example 10, the subject matter of any one or more of Examples 1-9 optionally include wherein the first recess contains a processor integrated circuit (IC) device, the ledge supports a memory IC device, and wherein the memory IC device is disposed on the processor IC device, wherein the second recess contains an IC device, and wherein the second recess includes a side wall that also contains an IC device.

In Example 11, the subject matter of any one or more of Examples 1-10 optionally include wherein the first recess contains a processor integrated circuit (IC) device, the ledge supports a memory IC device, wherein the memory IC device is disposed on the processor IC device, and wherein the prominence contains a high power density IC device, wherein the high power density IC device contacts a lid attached to an upper ledge of the contoured heat sink, wherein the high power density IC is disposed adjacent two legs that extend from the lid, and wherein the high power density IC contacts the lid through a thermal interface material.

Example 12 is a system-in-package apparatus comprising: a contoured heat sink made of an integral metallic material, the contoured heat sink including a back surface, and receiving surfaces of a first recess, and a subsequent recess, and wherein the back surface communicates through the metallic material to each of the first recess and the subsequent recess; a flexible printed wiring board (PWB) disposed to follow the contoured heat sink, wherein a processor integrated circuit (IC) device is disposed on the flexible PWB within the first recess, an IC device is disposed on the flexible PWB within the subsequent recess, and wherein a memory IC device is disposed on at least a portion of the processor IC device and at least on a portion of the flexible PWB.

In Example 13, the subject matter of Example 12 optionally includes a lid attached to an upper ledge of the contoured heat sink, wherein a portion of the flexible PWB is mated to the lid, and wherein at least one device mounted on the flexible PWB is disposed on the portion of the flexible PWB mated to the lid; and at least one leg extending from the lid, wherein the at least one leg contacts the flexible PWB.

In Example 14, the subject matter of any one or more of Examples 12-13 optionally include a thermal clip attached to a lower ledge of the contoured heat sink, wherein the thermal clip contacts a device at a back side thereof.

In Example 15, the subject matter of any one or more of Examples 12-14 optionally include wherein the contoured heat sink includes a lower ledge, an upper ledge, and an upper rim, wherein the upper rim is higher than the upper ledge, and wherein the lower ledge and the upper ledge each form a notch in the upper rim.

In Example 16, the subject matter of any one or more of Examples 12-15 optionally include a touch screen disposed upon the upper rim.

In Example 17, the subject matter of any one or more of Examples 12-16 optionally include a power source disposed below the upper rim.

Example 18 is a process of forming a system-in-package apparatus, comprising: mating a contoured heat sink to a flexible printed wiring board (PWB), wherein the contoured heat sink includes: an integral metallic material including a back surface, and receiving surfaces of a first recess, a subsequent recess, a ledge including a precipice, and a prominence, and wherein the back surface communicates through the metallic material to each of the first recess, subsequent recess, ledge, and prominence; wherein a plurality of devices is disposed upon the flexible PWB, and wherein some of the plurality of devices on the flexible PWB is mated to the flexible PWB where the flexible PWB is disposed against a receiving surface of the contoured heat sink; and wherein by mating the flexible PWB to the contoured heat sink, forms a contoured configuration touching each of the first recess, the subsequent recess, the ledge, and the prominence.

In Example 19, the subject matter of Example 18 optionally includes folding a portion of the flexible PWB and mating a lid to the flexible PWB, followed by fastening the lid to the contoured heat sink at an upper ledge.

In Example 20, the subject matter of any one or more of Examples 18-19 optionally include fastening a thermal clip to the contoured heat sink at a lower ledge, wherein the thermal clip contacts an IC device disposed in the first recess.

In Example 21, the subject matter of any one or more of Examples 18-20 optionally include disposing an IC device on the ledge, wherein the IC device is affixed both to the flexible PWB and to a portion of an IC device that is disposed in the first recess.

Example 22 is a computing system comprising: a contoured heat sink made of an integral metallic material, the contoured heat sink including a back surface, and receiving surfaces of a first recess, a subsequent recess, a ledge including a precipice, and a prominence, and wherein the back surface communicates through the metallic material to each of the first recess, subsequent recess, ledge, and prominence; a flexible printed wiring board (PWB), wherein a plurality of devices is disposed upon the flexible PWB, and wherein some of the plurality of devices on the flexible PWB is mated to the flexible PWB where the flexible PWB is disposed against a receiving surface of the contoured heat sink; wherein the flexible PWB forms a contoured configuration touching each of the first recess, the subsequent recess, the ledge, and the prominence; wherein the contoured heat sink includes an upper rim; a power source disposed below the upper rim; and a display disposed on the upper rim.

In Example 23, the subject matter of Example 22 optionally includes wherein the display is a touch display.

In Example 24, the subject matter of any one or more of Examples 22-23 optionally include wherein the computing system includes a touch display, and wherein the computing system is selected from the group consisting of a wrist watch computing system, a telephonic computing system, and a tablet computing system.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system-in-package apparatus comprising:
   a contoured heat sink made of an integral metallic material, the contoured heat sink including a back surface, and receiving surfaces of a first recess, a subsequent recess, a ledge including a precipice, and a prominence, and wherein the back surface communicates through the metallic material to each of the first recess, subsequent recess, ledge, and prominence;
   a flexible printed wiring board (PWB), wherein a plurality of devices are disposed upon the flexible PWB, and wherein a side of the PWB opposite the plurality of devices is attached to the receiving surface of the contoured heat sink; and
   wherein the flexible PWB forms a contoured configuration touching each of the first recess, the subsequent recess, the ledge, and the prominence.

2. The system-in-package apparatus of claim 1, further including a lid attached to an upper ledge of the contoured heat sink, wherein a portion of the flexible PWB is mated to the lid, and wherein at least one device mounted on the flexible PWB is disposed on the portion of the flexible PWB mated to the lid.

3. The system-in-package apparatus of claim 1, further including:
   a lid attached to an upper ledge of the contoured heat sink, wherein a portion of the flexible PWB is mated to the lid, and wherein at least one device mounted on the flexible PWB is disposed on the portion of the flexible PWB mated to the lid; and
   at least one leg extending from the lid, wherein the at least one leg contacts the flexible PWB.

4. The system-in-package apparatus of claim 1, further including a thermal clip attached to a lower ledge of the contoured heat sink, wherein the thermal clip contacts a device at a back side thereof.

5. The system-in-package apparatus of claim 1, further wherein the contoured heat sink includes a lower ledge, an upper ledge, and an upper rim, wherein the upper rim is higher than the upper ledge, and wherein the lower ledge and the upper ledge each form a notch in the upper rim.

6. The system-in-package of claim 5, further including a touch screen disposed upon the upper rim.

7. The system-in-package of claim 5, further including a power source disposed below the upper rim.

8. The system-in-package of claim 1, wherein the first recess contains a processor integrated circuit (IC) device, the ledge supports a memory IC device, and wherein the memory IC device is disposed on the processor IC device.

9. The system-in-package of claim 1, wherein the first recess contains a processor integrated circuit (IC) device, the ledge supports a memory IC device, and wherein the memory IC device is partially disposed on the processor IC device and partially disposed above the ledge.

10. The system-in-package of claim 1, wherein the first recess contains a processor integrated circuit (IC) device, the ledge supports a memory IC device, and wherein the memory IC device is disposed on the processor IC device, wherein the second recess contains an IC device, and wherein the second recess includes a side wall that also contains an IC device.

11. The system-in-package of claim 1, wherein the first recess contains a processor integrated circuit (IC) device, the ledge supports a memory IC device, wherein the memory IC device is disposed on the processor IC device, and wherein the prominence contains a high power density IC device, wherein the high power density IC device contacts a lid attached to an upper ledge of the contoured heat sink, wherein the high power density IC is disposed adjacent two legs that extend from the lid, and wherein the high power density IC contacts the lid through a thermal interface material.

* * * * *